United States Patent
Pan et al.

(10) Patent No.: US 9,812,190 B2
(45) Date of Patent: Nov. 7, 2017

(54) CELL STRUCTURE OF 4T RANDOM ACCESS MEMORY, RANDOM ACCESS MEMORY AND OPERATION METHODS

(71) Applicants: Tsinghua University, Beijing (CN); Graduate School at Shenzhen, Tsinghua University, Shenzhen, Guangdong (CN)

(72) Inventors: Liyang Pan, Beijing (CN); Xinhong Hong, Beijing (CN); Dong Wu, Beijing (CN)

(73) Assignees: TSINGHUA UNIVERSITY, Beijing (CN); GRADUATE SCHOOL AT SHENZHEN, TSINGHUA UNIVERSITY, Shenzhen, Guangdong (CN)

( * ) Notice: Subject to any disclaimer, the term of this patent is extended or adjusted under 35 U.S.C. 154(b) by 0 days.

(21) Appl. No.: 14/772,371

(22) PCT Filed: Apr. 17, 2015

(86) PCT No.: PCT/CN2015/076891
§ 371 (c)(1),
(2) Date: Sep. 2, 2015

(87) PCT Pub. No.: WO2015/158305
PCT Pub. Date: Oct. 22, 2015

(65) Prior Publication Data
US 2016/0111146 A1   Apr. 21, 2016

(30) Foreign Application Priority Data

Apr. 17, 2014   (CN) .......................... 2014 1 0155104
Dec. 4, 2014    (CN) .......................... 2014 1 0729870

(51) Int. Cl.
*G11C 11/419*   (2006.01)
*G11C 11/406*   (2006.01)
(Continued)

(52) U.S. Cl.
CPC .......... *G11C 11/419* (2013.01); *G11C 11/406* (2013.01); *G11C 11/412* (2013.01);
(Continued)

(58) Field of Classification Search
CPC ... G11C 11/419; G11C 11/418; G11C 11/412; G11C 11/406; G11C 11/4125; G11C 11/403
(Continued)

(56) References Cited

U.S. PATENT DOCUMENTS

2006/0067110 A1 *   3/2006   Forbes .................. G11C 11/412
                                                          365/154

OTHER PUBLICATIONS

Xinhong, H. et al., Simulation and research on a 4T-cell based duplication redundancy SRAM for SEU radiation hardening, Journal of Semiconductors, 2015, 36(11), 114003-1.*

* cited by examiner

*Primary Examiner* — Son Dinh
*Assistant Examiner* — Jerome Leboeuf
(74) *Attorney, Agent, or Firm* — Kile Park Reed & Houtteman LLC

(57) ABSTRACT

The present disclosure provides a cell structure, a random access memory and operation methods. The cell structure with four transistors, including a first N-type transistor, a first P-type transistor, a second N-type transistor and a second P-type transistor, in which an absolute value of a threshold voltage of the first N-type transistor is greater than an absolute value of a threshold voltage of the second N-type transistor, and an absolute value of a threshold voltage of the (Continued)

first P-type transistor is greater than an absolute value of a threshold voltage of the second P-type transistor. The random access memory, including: two identical memory cell arrays including the cell structure with four transistors, a data write circuit and a data read circuit, by using Two Modular Redundancy harden method, and thus reading correctly and avoiding the mistake reversal caused by the single event upset effect.

20 Claims, 4 Drawing Sheets

(51) Int. Cl.
  *G11C 11/412* (2006.01)
  *G11C 11/418* (2006.01)
  *G11C 11/403* (2006.01)
(52) U.S. Cl.
  CPC .......... *G11C 11/418* (2013.01); *G11C 11/403* (2013.01); *G11C 11/4125* (2013.01)
(58) Field of Classification Search
  USPC .............................................. 365/154, 230.05
  See application file for complete search history.

CELL STRUCTURE OF 4T RANDOM ACCESS MEMORY, RANDOM ACCESS MEMORY AND OPERATION METHODS

CROSS-REFERENCE TO RELATED APPLICATION

This application is a U.S. national phase application of International Application No. PCT/CN2015/076891, filed on Apr. 17, 2015, which is based upon and claims priority to Chinese Patent Application No. 201410155104.X, filed on Apr. 17, 2014, and Chinese Patent Application No. 201410729870.2, filed on Dec. 4, 2014, the entirety contents of which are incorporated herein by reference.

TECHNICAL FIELD

The present disclosure relates to a memory field, and more particularly, to a cell structure of a random access memory, a random access memory, a read operation method for a random access memory and a write operation method for a random access memory.

BACKGROUND

A random access memory (RAM) is a memory capable of being read and written, and may access each memory cell according to an instruction randomly and individually in a fixed access time and regardless of an address of the memory cell. MOS-type memories may be divided into two types according to the means of storing information, which are dynamic random access memories (DRAMs) and static random access memories (SRAMs).

A DRAM is a common system memory due to its density and speed. The memory cell of the DRAM is a capacitor including electric charges leaked with time, leading to that data in the DRAM is lost. The DRAM may keep the data for a short time. In order to solve this problem, the memory cell of the DRAM is required to be refreshed at intervals. If the memory cell is not refreshed, data stored in the memory cell may be lost. The refresh frequency of the DRAM depends on a manufacturing technology and a design of the memory cell. The refresh frequency of the DRAM may affect the performance and power consumption. A disadvantage of the DRAM is that a leakage of electricity at a gate electrode of a memory transistor increases obviously as a size of an integrated circuit decreases, and the stored data may be lost very soon.

A memory circuit of a SRAM is based on a bistable trigger. The state of the SRAM is stable and data is lost as long as the power does not disenergized. The advantages of the SRAM are that it is unnecessary to refresh the SRAM, a control circuit of the SRAM is simple. The disadvantage of the SRAM is that the integration level is low, such that the size of the SRAM is bigger than that of the DRAM with the same capacity and that the power consumption is high. Thus, the SRAM may occupy a part of areas of a main board.

As the development of the nuclear power technology and the space technology, more and more electronic devices are applied in various radiation environments. As the increased demand for the system performance in the space application, the decreased size of the device and the improvement of the technology, the sensitivity of a semiconductor to the space radiation becomes high, and the influence of the single event effect (SEE) is extended. The SRAM is widely used in various military and space systems. The bistable circuit in the SRAM is particularly sensitive to the single event upset effect, resulting in errors occurring in the data and instructions stored in the SRAM or even a failure occurring in the space system. Thus, it is necessary to harden the SRAM.

The single event upset refers that after a single particle comes into a well region or a gate capacitance region of a device, electrons of an electron hole pair generated in an ionization trajectory of the single particle are collected at positive voltage area and the electron hole flows to a low potential direction, and if the well region (or the gate capacitance region) has been filled with electrons the state of the device does not change, else if the well region (or the gate capacitance region) is partially filled with the electrons generated according to the single event upset, and the state changes after enough electrons are collected.

With regard to a CMOS SRAM memory cell with standard six transistors, as shown in FIG. 1, generally, the depletion layer of a reverse biased PN junction at a drain area of a MOS transistor which is in an OFF state is a sensitive area of the single event upset. Assuming that Q="1" and Qn="0", a "1" is stored in the memory cell, transistors N2 and P1 are in an ON state and transistors N1 and P2 are in an OFF state. At this time, a high-energy particle comes into the drain area of the transistor N1 which is in an OFF state. The transient current resulted from the high-energy particle pulls the level of the drain electrode of the transistor N1 (i.e. the level at the node Q) down to a low level, and the transistor P1 is still in an ON state. And then, a capacitance at the node Q is charged by a power supply VDDI, and the memory cell is in an unstable state. Meanwhile, since the level at the node Q is pulled down to the low level by the transient current, the transistor N2 is turned off, the transistor P2 is turned on and the level at the node Qn is pulled up. And then the high level at the node Qn results in the transistor N1 being turned on and the transistor P2 being turned off, thus the "1" stored in the memory cell is changed to a "0". Therefore, after the high-energy particle comes into the sensitive area of the SRAM cell, if a recovery time tr is less than a feedback time tf, the high-energy particle does not result in the single event upset, if the recovery time tr is greater than the feedback time tf, the transient current due to the high-energy particle results in the single event upset.

At present, there are many methods to solve the single event upset, including a resistance harden method, a technology harden method, a system error correction harden method, a circuit design harden method, etc. The resistance harden method is restricted in practical practice because that the technology of the resistance is required to be introduced, it is difficult to integrate and the effect cannot be guaranteed in a severe environment. The technology harden method (such as a SOI technology, an extension technology, etc.) may improve the capability of resisting the single event upset of the memory cell by decreasing the charges collected at the sensitive area. However, the disadvantage of the technology harden method is that its cost is high and it is not compatible with a CMOS technology. The system error correction harden method may solve errors resulted from the SRAM memory cell due to the single event effect in a peripheral circuit, such that the accuracy of the system is guaranteed. But the overhead of the error correction circuit increases, the refresh frequency of the error correction increases and the performance of the memory is degraded, since the line width is reduced to a scale of nanometer, the size of the SRAM memory cell constantly decreases and the error rate increases sharply. The circuit design harden method may obtain a good capability of resisting the radiations by designing a complex memory cell using the ideas of "redundance" and "recovery". Conventional memory cells include 6T2C, 6T2C2R, 8T, 10T, DICE, etc. But a peripheral circuit in a conventional circuit design harden method is complex and a size of the memory cell is huge, such that it is difficult to apply the conventional circuit design harden method in a node with a size greater than 0.18 nanometer.

SUMMARY

In order to solve the problems in the related art, the present disclosure provides a cells structure of a random access memory, a random access memory, a read operation method for a random access memory and a write operation method for a random access memory.

A first aspect of embodiments of the present disclosure provides a cell structure of a random access memory, including: a first N-type transistor (N1), a first P-type transistor (P1), a second N-type transistor (NG1) and a second P-type transistor (PG1); in which a source electrode of the first N-type transistor (N1) is connected to an adjustable low voltage (VSSI), a source electrode of the first P-type transistor (P1) is connected to an adjustable high voltage (VDDI), a drain electrode of the first N-type transistor (N1) is connected to a gate electrode of the first P-type transistor (P1), a gate electrode of the first N-type transistor (N1) is connected to a drain electrode of the first P-type transistor (P1), a drain electrode of the second N-type transistor (NG1) is connected to a bit line (BL), a gate electrode of the second N-type transistor (NG1) is connected to a write word line (WWL), a source electrode of the second N-type transistor (NG1) is connected to a first node (Q) between the gate electrode of the first N-type transistor (N1) and the drain electrode of the first P-type transistor (P1), a drain electrode of the second P-type transistor (PG1) is connected to a complementary bit line (BLn), a gate electrode of the second P-type transistor (PG1) is connected to a read word line (RWL), a source electrode of the second P-type transistor (PG1) is connected to a second node (Qn) between the drain electrode of the first N-type transistor (N1) and the gate electrode of the first P-type transistor (P1).

In an embodiment of the present disclosure, an absolute value of a threshold voltage of the first N-type transistor (N1) is greater than an absolute value of a threshold voltage of the second N-type transistor (NG1), and an absolute value of a threshold voltage of the first P-type transistor (P1) is greater than an absolute value of a threshold voltage of the second P-type transistor (PG1).

In an embodiment of the present disclosure, a substrate of the first N-type transistor (N1) and a substrate of the second N-type transistor (NG1) are connected to a ground voltage (GND) respectively, and a substrate of the first P-type transistor (P1) and a substrate of the second P-type transistor (PG1) are connected to a power voltage (VDD) respectively.

In an embodiment of the present disclosure, the adjustable low voltage (VSSI) is greater than or equal to the ground voltage (GND) and less than a half of the power voltage (VDD/2); the adjustable high voltage (VDDI) is less than or equal to the power voltage (VDD) and greater than the half of the power voltage (VDD/2).

In an embodiment of the present disclosure, if the cell structure is in a maintain operation, the write word line (WWL) is maintained at a first low level, the read word line (RWL) is maintained at a first high level, the bit line (BL) is maintained at the first low level, the complementary bit line (BLn) is maintained at the first high level, the adjustable high voltage (VDDI) is maintained at a second high level, and the adjustable low voltage (VSSI) is maintained at a second low level, in which the first high level is higher than the second high level, the first low level is lower than the second low level.

In an embodiment of the present disclosure, if the cell structure is in a write operation including three phases of writing, the write word line (WWL) is at a first low level in a first phase of writing, and is at a first high level in a second phase of writing and a third phase of writing; the read word line (RWL) is at the first low level in the first phase of writing and the second phase of writing, and is at the high level in the third phase of writing; the bit line (BL) is maintained at the first high level in the first phase of writing, the second phase of writing and the third phase of writing, if "1" is written, or the bit line (BL) is maintained at the first low level in the first phase of writing, the second phase of writing and the third phase of writing, if "0" is written; the complementary bit line (BLn) is maintained at the first high level in the first phase of writing, the second phase of writing and the third phase of writing; the adjustable high voltage (VDDI) is maintained at a second high level in the first phase of writing, the second phase of writing and the third phase of writing, in which the first high level is higher than the second high level; and the adjustable low voltage (VSSI) is maintained at a second low level in the first phase of writing, and is maintained at the first low level in the second phase of writing and the third phase of writing, in which the first low level is lower than the second low level.

In an embodiment of the present disclosure, if the cell structure is in a read operation including two phases of reading, the write word line (WWL) is maintained at a first low level in a first phase of reading and a second phase of reading; the read word line (RWL) is at a first high level in the first phase of reading, and is at the first low level in the second phase of reading; the bit line (BL) is maintained at the first low level in the first phase of reading and the second phase of reading; the complementary bit line (BLn) is maintained at the first high level in the first phase of reading and descends from the first high level to the first low level gradually in the second phase of reading, if "1" is read, or the complementary bit line (BLn) is maintained at the first high level in the first phase of reading and the second phase of reading if "0" is read; the adjustable high voltage (VDDI) is maintained at the first high level in the first phase of reading and the second phase of reading; and the adjustable low voltage (VS SI) is maintained at a second low level in the first phase of reading and the second phase of reading, in which the first low level is lower than the second low level.

In an embodiment of the present disclosure, if the cell structure is in a refresh operation, the write word line (WWL) is maintained at a first voltage (Vthn), in which the first voltage (Vthn) is a larger of the absolute value of the threshold voltage of the second N-type transistor (NG1) and the absolute value of the threshold voltage of the first N-type transistor (N1); the read word line (RWL) is maintained at a second voltage (VDD−|Vthp|), in which the second voltage (VDD−|Vthp|) is a difference value of the power voltage (VDD) minus a third voltage (|Vthp|), in which the third voltage (|Vthp|) is a larger of the absolute value of the threshold voltage of the second P-type transistor (PG1) and the absolute value of the threshold voltage of the first P-type transistor (P1); the bit line (BL) is maintained at a first low level; the complementary bit line (BLn) is maintained at a first high level; the adjustable high voltage (VDDI) is maintained at a second high level, in which the first high level is higher than the second high level; the adjustable low voltage (VSSI) is maintained at a second low level, in which the first low level is lower than the second low level.

A second aspect of embodiments of the present disclosure provides a random access memory, including two identical memory cell arrays, a write data circuit and a read data circuit; in which array structures of the two identical memory cell arrays are same, and same original stored information is stored in memory cells with a same address in the two identical memory cell arrays; the write data circuit is configured to write same data into the memory cells with the same address in the two identical memory cell arrays; the read data circuit is configured to select two pieces of stored information from the memory cells with the same address in the two identical memory cell arrays, and to output "0" if the two pieces of stored information are different or output one of the two pieces of stored information if the two pieces of stored information are same.

With the random access memory according to embodiments of the present disclosure, an aim of resisting the single event upset is realized reliably. And compared to other harden methods, the random access memory according to the harden method of the present disclosure has a same access speed as other random access memories according to other harden methods and a high error correction capability and further more other advantages, such as a small size, a simple peripheral circuit, and a good compatibility, such that the random access memory according to embodiments of the present disclosure may be wildly applied in a field of a memory resisting the radiations.

In an embodiment of the present disclosure, each of the two identical memory cell arrays includes a memory cell with four transistors, in which the memory cell has a cell structure according to the first aspect of embodiments of the present disclosure.

In an embodiment of the present disclosure, the read data circuit includes: a data extract circuit, connected to the two identical memory cell arrays, configured to select the two pieces of stored information from the memory cells with the same address in the two identical memory cell arrays; a logic circuit, connected to the data extract circuit, configured to judge whether the two pieces of stored information are same; an output circuit, connected to the logic circuit, configured to output "0" if the two pieces of stored information are different or to output one of the two pieces of stored information if the two pieces of stored information is same.

A third aspect of embodiments of the present disclosure provides a read operation method for a random access memory, in which the read operation method is applied in the random access memory according to the second aspect of embodiments of the present disclosure and the read operation method includes: reading data from two memory cells with a same address in the two identical memory cell arrays; determining whether the data from the two memory cells with a same address in the two identical memory cell arrays is same; outputting "0", if the data from the two memory cells with a same address in the two identical memory cell arrays is different; outputting one of the data from the two memory cells with a same address in the two identical memory cell arrays, if the data from the two memory cells with a same address in the two identical memory cell arrays is same.

A forth aspect of embodiments of the present disclosure provides a write operation method for a random access memory, in which the write operation method is applied in the random access memory according to the second aspect of embodiments of the present disclosure and the write operation method includes: writing same data into two memory cells with a same address in the two identical memory cell arrays.

A fifth aspect of embodiments of the present disclosure provides a random access memory, including a plurality of cell structures of the random access memory according to the first aspect of embodiments of the present disclosure.

The random access memory according to embodiments of the present disclose has advantages that a control circuit of the random access memory is simple, a state of the random access memory is stable, data is not lost as long as the power is not disenergized and the power consumption is low. An integration level of the random access memory according to embodiments of the present disclosure is high, such that the random access memory is an effective solution of a memory cell of an IP core in a system on a chip (SOC) and is suitable for a computer system with a huge capacity.

A sixth aspect of embodiments of the present disclosure provides a write operation method for a random access memory, the write operation method is applied in the random access memory according to the fifth aspect of embodiments of the present disclosure and the write operation method includes: receiving a given address, wherein the given address comprises a row address and a column address; performing a read operation on all data in a selected row corresponding to the row address; writing data to be written into a memory cell of a selected column corresponding to the column address in the selected row, meanwhile rewriting stored data into a memory cell of an unselected column corresponding to the column address in the selected row, in which the stored data is data previously read.

A seventh aspect of embodiments of the present disclosure provides a write operation method for a random access memory, the write operation method is applied in the random access memory according to the fifth aspect of embodiments of the present disclosure and the write operation method includes: performing a logic operation on a row address signal obtained based on row decoding and a column address signal obtained based on column decoding after an address is decoded; and performing the write operation on a selected column and no operation on other unselected columns.

It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more than two, unless specified otherwise.

In the description of the present disclosure, it should be understood that, unless specified or limited otherwise, the terms "mounted," "connected," and "coupled" and variations thereof are used broadly and encompass such as mechanical or electrical mountings, connections and couplings, also can be inner mountings, connections and couplings of two components, and further can be direct and indirect mountings, connections, and couplings, which can be understood by those skilled in the art according to the detail embodiment of the present disclosure.

1. A Cell Structure of a Random Access Memory

Figure 1:
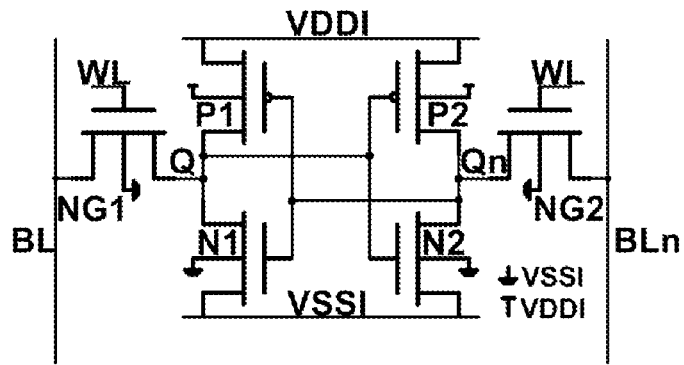
FIG. 1 is a schematic diagram illustrating a SRAM memory cell with six transistors in the related art.
Figure 2:
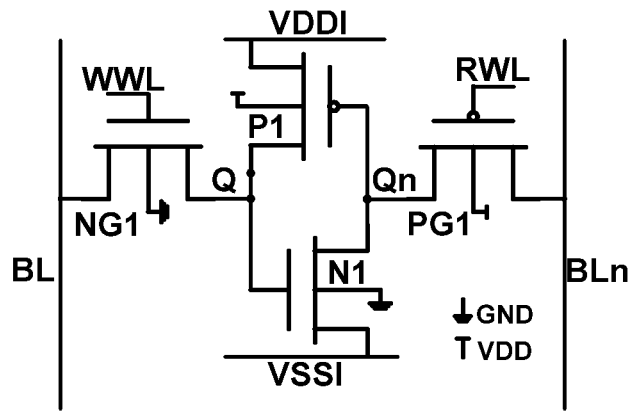
FIG. 2 is a schematic diagram illustrating a cell structure of a random access memory according to an exemplary embodiment of the present disclosure.

As shown in FIG. 2, the present disclosure provides a cell structure of a random access memory (such as a shrunken static random access memory (SSRAM)), including a first N-type transistor (N1), a first P-type transistor (P1), a second N-type transistor (NG1) and a second P-type transistor (PG1). A source electrode of the first N-type transistor (N1) is connected to an adjustable low voltage (VSSI), a source electrode of the first P-type transistor (P1) is connected to an adjustable high voltage (VDDI), a drain electrode of the first N-type transistor (N1) is connected to a gate electrode of the first P-type transistor (P1), a gate electrode of the first N-type transistor (N1) is connected to a drain electrode of the first P-type transistor (P1), a drain electrode of the second N-type transistor (NG1) is connected to a bit line (BL), a gate electrode of the second N-type transistor (NG1) is connected to a write word line (WWL), a source electrode of the second N-type transistor (NG1) is connected to a first node (Q) between the gate electrode of the first N-type transistor (N1) and the drain electrode of the first P-type transistor (P1), a drain electrode of the second P-type transistor (PG1) is connected to a complementary bit line (BLn), a gate electrode of the second P-type transistor (PG1) is connected to a read word line (RWL), a source electrode of the second P-type transistor (PG1) is connected to a second node (Qn) between the drain electrode of the first N-type transistor (N1) and the gate electrode of the first P-type transistor (P1).

In the cell structure of a random access memory according to this embodiment, the second N-type transistor (NG1) is a write data control switcher, configured to control whether to write data. The second P-type transistor (PG1) is a read data control switcher, configured to control whether to read data. The first N-type transistor (N1) is a data storage transistor, and charges stored in a gate capacitance of the first N-type transistor (N1) represent stored data. The first P-type transistor (P1) is a load transistor, configured to keep the charges stored in the gate capacitance of the first N-type transistor (N1).

In an embodiment of the present disclosure, the first N-type transistor (N1), the first P-type transistor (P1), the second N-type transistor (NG1) and the second P-type transistor (PG1) may be the MOS transistor.

Compared to the cell structure of the conventional DRAM, the frequency of refresh operations for the cell structure of the SRAM according to embodiments of the present disclosure is few, and a control circuit of the cell structure is simple, a state of the cell structure is stable. The stored data is not lost as long as the cell structure of SRAM is not disenergized, and the power consumption of the cell structure is low. Compared to the cell structure of the conventional SRAM, the integration level of the cell structure of the SRAM according to embodiments of the present disclosure is high, such that the cell structure is an effective solution of a memory cell of an IP core in a SOC, and is suitable for a computer system with a huge capacity.

In an embodiment of the present disclosure, an absolute value of a threshold voltage of the first N-type transistor (N1) is greater than an absolute value of a threshold voltage of the second N-type transistor (NG1). Moreover, an absolute value of a threshold voltage of the first P-type transistor (P1) is greater than an absolute value of a threshold voltage of the second P-type transistor (PG1). Table 1 illustrates types of the first N-type transistor (N1), the second N-type transistor (NG1), the first P-type transistor (P1) and the second P-type transistor (PG1) in an embodiment. With these types, the stability of the stored data may be improved. The detailed reasons will be described in the following,

TABLE 1

| Name of a MOS transistor | Type of a MOS transistor | Threshold voltage (Unit: V) | Length and width of a MOS transistor (Unit: nm) |
|---|---|---|---|
| NG1 | a NMOS with a standard threshold | Vthn = 0.41 | w = 100/1 = 60 |
| N1 | a NMOS with a high threshold | Vthn = 0.513 | w = 85/1 = 75 |
| P1 | a PMOS a high threshold | Vthp = −0.535 | w = 85/1 = 75 |
| PG1 | a PMOS with a standard threshold | Vthp = −0.438 | w = 100/1 = 60 |

In an embodiment of the present disclosure, a substrate of the first N-type transistor (N1) and a substrate of the second N-type transistor (NG1) are connected to a ground voltage (GND) respectively, and a substrate of the first P-type transistor (P1) and a substrate of the second P-type transistor (PG1) are connected to a power voltage (VDD) respectively.

In an embodiment of the present disclosure, the adjustable low voltage (VSSI) is greater than or equal to the ground voltage (GND) and less than a half of the power voltage (VDD/2); the adjustable high voltage (VDDI) is less than or equal to the power voltage (VDD) and greater than the half of the power voltage (VDD/2).

2. Operations for the Cell Structure of a Random Access Memory

Operations for the cell structure of a random access memory may include a maintain operation, a write operation, a read operation and a refresh operation. The detailed descriptions are as follows.

2.1 The Maintain Operation for the Cell Structure of a Random Access Memory

Figure 3:
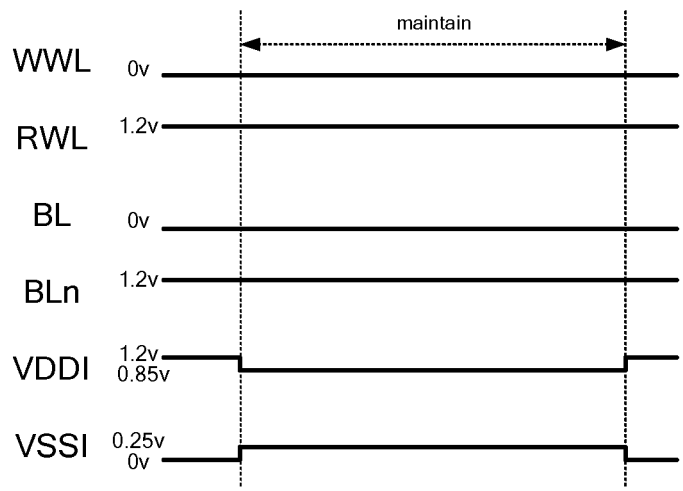
FIG. 3 is a sequence diagram illustrating a maintain operation for a cell structure of a random access memory according to an exemplary embodiment of the present disclosure.

As shown in FIG. 3, the maintain operation for the cell structure of a random access memory according to embodiments of the present disclosure includes: maintaining the write word line (WWL) at a first low level; maintaining the read word line (RWL) at a first high level; maintaining the bit line (BL) at the first low level; maintaining the complementary bit line (BLn) at the first high level; maintaining the adjustable high voltage (VDDI) at a second high level; maintaining the adjustable low voltage (VSSI) at a second low level. The first high level is higher than the second high level, and the first low level is lower than the second low level.

Specifically, when the cell structure is in a state of maintaining a "0", a "0" is stored in the first node (Q), a "1" is stored in the second node (Qn), both the first P-type transistor (P1) and the first N-type transistor (N1) are in an OFF state. Due to an electricity leakage of the first P-type transistor (P1) and an electricity leakage of the first N-type transistor (N1), the voltage of the first node (Q) rises gradually, and the voltage of the second node (Qn) drops gradually. If the rise of the voltage of the first node (Q) results in the first N-type transistor (N1) being turned on, or the drop of the voltage of the second node (Qn) results in the first P-type transistor (P1) being turned on, the stored data is lost. In order to maintain the voltage of the first node (Q) at a low level, the first P-type transistor (P1) is configured as a PMOS transistor with a high threshold to reduce the leakage current and the second N-type transistor (NG1) is configured as a NMOS transistor with a standard threshold to increase the leakage current (a maintain state: the adjustable high voltage (VDDI) is at a high level and the bit line (BL) is grounded). In order to maintain the voltage of the second node (Qn) at the high level, the first N-type transistor (N1) is used as a NMOS transistor with a high threshold to reduce the leakage current and the second P-type transistor (PG1) is configured as a PMOS transistor with a standard threshold to increase the leakage current (a maintain state: the adjustable low voltage (VSSI) is at the high level and the complementary bit line (BLn) is charged to the first high level).

When the cell structure is in a state of maintaining a "1", a "1" is stored in the first node (Q), a "0" is stored in the second node (Qn), both the first P-type transistor (P1) and the first N-type transistor (N1) are in an ON state. The maintain performance of the cell structure is good.

In a summary, the maintain operation has following advantages.

(1) The stability of cell structure of the SRAM is improved. According to the above description and analysis, if a difference value of a gate voltage ($V_{Gn}$) of the first N-type transistor (N1) minus the adjustable low voltage (VSSI) is greater than the threshold voltage of the first N-type transistor (N1) (i.e. $V_{Gn}-VSSI>V_{thn}$) due to the rise of the voltage of the first node (Q), the first N-type transistor (N1) is turned on, the voltage of the second node (Qn) is pulled down and the stored data in the cell structure is lost. If a difference value of a gate voltage ($V_{Gp}$) of the first P-type transistor (P1) minus the adjustable high voltage (VDDI) is less than the threshold voltage of the first P-type transistor (P1) (i.e. $V_{Gp}-VDDI<V_{thp}$) due to the drop of the voltage of the second node (Qn), the first P-type transistor (P1) is turned on, the voltage of the first node (Q) is pulled up and the stored data in the cell structure is lost. In order to improve the stability of the cell structure of the SRAM, in the maintain state, the adjustable high voltage (VDDI) and the adjustable low voltage (VSSI) are adjusted, for example, VSSI=0.25 v, VDDI=0.85 v.

(2) The static power consumption of the cell structure of the SRAM is reduced. If the adjustable low voltage (VSSI) in the maintain state is increased, the leakage current of the first N-type transistor (N1) may be reduced. If the adjustable high voltage (VDDI) in the maintain state is decreased, the leakage current of the first P-type transistor (P1) may be reduced. In order to reduce the static power consumption of the cell structure of the SRAM, in the maintain state, the adjustable high voltage (VDDI) and the adjustable low voltage (VSSI) are adjusted, for example, VSSI=0.25 v, VDDI=0.85 v.

2.2 The Write Operation for the Cell Structure of a Random Access Memory

Figure 4:
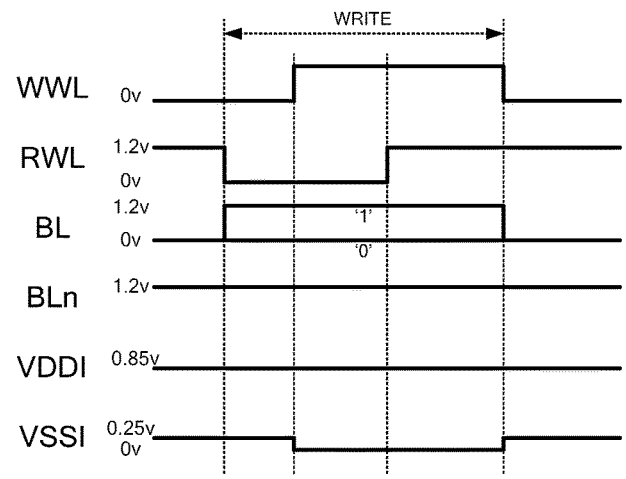
FIG. 4 is a sequence diagram illustrating a write operation for a cell structure of a random access memory according to an exemplary embodiment of the present disclosure.

If the cell structure is selected for writing, the write operation includes three phases of writing, as shown in FIG. 4. Specifically, the write word line (WWL) is maintained at a first low level in a first phase of writing, and is maintained at a first high level in a second phase of writing and a third phase of writing; the read word line (RWL) is maintained at the first low level in the first phase of writing and the second phase of writing, and is maintained at the high level in the third phase of writing; the bit line (BL) is maintained at the first high level in the first phase of writing, the second phase of writing and the third phase of writing, if "1" is written, or the bit line (BL) is maintained at the first low level in the first phase of writing, the second phase of writing and the third phase of writing, if "0" is written; the complementary bit line (BLn) is maintained at the first high level in the first phase of writing, the second phase of writing and the third phase of writing; the adjustable high voltage (VDDI) is maintained at a second high level in the first phase of writing, the second phase of writing and the third phase of writing, in which the first high level is higher than the second high level; and the adjustable low voltage (VSSI) is maintained at a second low level in the first phase of writing, and is maintained at the first low level in the second phase of writing and the third phase of writing, in which the first low level is lower than the second low level.

It should be noted that, if a "0" is written into the cell structure, the first P-type transistor (P1) is changed from an ON state to an OFF state, the first N-type transistor (N1) is changed from an ON state to an OFF state, and it takes a long time to write a "1" into the second node (Qn). In order to save writing time, the write operation according to embodiments of the present disclosure includes three phases of writing. If a "1" is written into the cell structure, it is necessary to change the first N-type transistor (N1) from an OFF state to an ON state and to ensure that the difference value of the gate voltage ($V_{Gn}$) of the first N-type transistor (N1) minus the adjustable low voltage (VSSI) is greater than the threshold voltage of the first N-type transistor (N1) (i.e. $V_{Gn}$-VSSI>$V_{thn}$). Due to a loss of the threshold voltage of the second N-type transistor (NG1), a voltage less than the power voltage (VDD) may be written into the first node (Q) and represents "1", and it is difficult to turn on the first N-type transistor (N1). The adjustable high voltage (VDDI) and the adjustable low voltage (VSSI) in a writing state are adjusted, for example, VSSI=0 v, VDDI=0.85 v.

2.3 The Read Operation for the Cell Structure of a Random Access Memory

Figure 5:
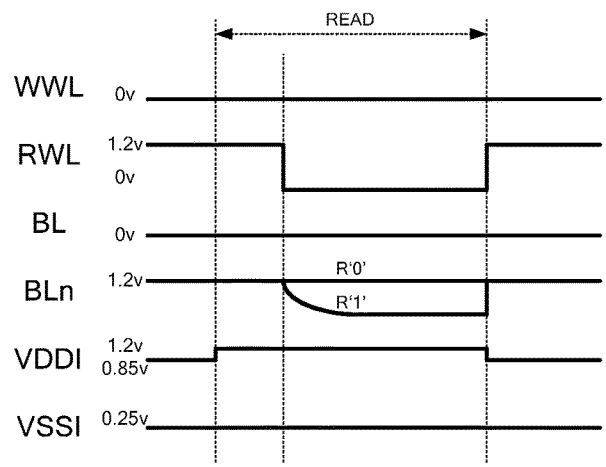
FIG. 5 is a sequence diagram illustrating a read operation for a cell structure of a random access memory according to an exemplary embodiment of the present disclosure.

As shown in FIG. 5, the read operation for the cell structure according to embodiments of the present disclosure includes two phases of reading. Specifically, the write word line (WWL) is maintained at a first low level in a first phase of reading and a second phase of reading; the read word line (RWL) is maintained at a first high level in the first phase of reading, and is maintained at the first low level in the second phase of reading; the bit line (BL) is maintained at the first low level in the first phase of reading and the second phase of reading; the complementary bit line (BLn) is maintained at the first high level in the first phase of reading and descended from the first high level to the first low level gradually in the second phase of reading, if a "1" is read, or the complementary bit line (BLn) is maintained at the first high level in the first phase of reading and the second phase of reading if a "0" is read; the adjustable high voltage (VDDI) is maintained at the first high level in the first phase of reading and the second phase of reading; and the adjustable low voltage (VSSI) is maintained at a second low level in the first phase of reading and the second phase of reading. The first low level is lower than the second low level.

It should be noted that, if a "0" is read, the complementary bit line (BLn) does not discharge and it is not necessary to consider the speed and the power consumption of the cell structure. If a "1" is read, the complementary bit line (BLn) discharges via the first N-type transistor (N1), the reading speed depends on a discharging speed of the first N-type transistor (N1). The higher the voltage of the first node (Q) is, the faster the reading speed is. The adjustable high voltage (VDDI) and the adjustable low voltage (VSSI) in a reading state are adjusted, for example, VSSI=0 v, VDDI=1.2 v.

2.4 The Refresh Operation for the Cell Structure of a Random Access Memory

Figure 6:
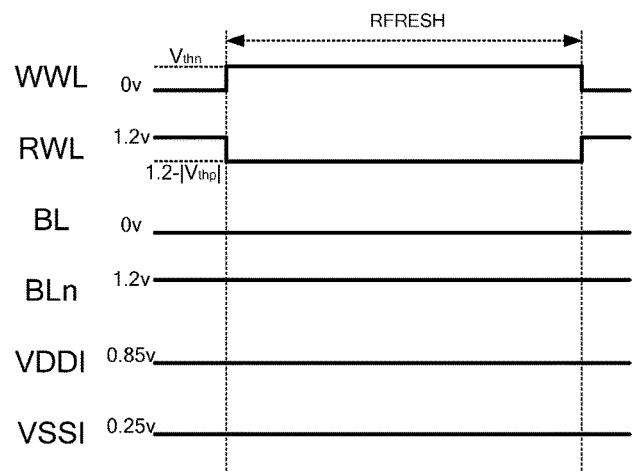
FIG. 6 is a sequence diagram illustrating a refresh operation for a cell structure of a random access memory according to an exemplary embodiment of the present disclosure.

As shown in FIG. 6, the refresh operation for the cell structure according to embodiments of the present disclosure includes: the write word line (WWL) is maintained at a first voltage (Vthn), in which the first voltage (Vthn) is a larger of the absolute value of the threshold voltage of the second N-type transistor (NG1) and the absolute value of the threshold voltage of the first N-type transistor (N1); the read word line (RWL) is maintained at a second voltage (VDD−|Vthp|), in which the second voltage (VDD−|Vthp|) is a difference value of the power voltage (VDD) minus a third voltage (|Vthp|), in which the third voltage (|Vthp|) is a larger of the absolute value of the threshold voltage of the second P-type transistor (PG1) and the absolute value of the threshold voltage of the first P-type transistor (P1); the bit line (BL) is maintained at a first low level; the complementary bit line (BLn) is maintained at a first high level; the adjustable high voltage (VDDI) is maintained at a second high level, in which the first high level is higher than the second high level; the adjustable low voltage (VSSI) is maintained at a second low level, in which the first low level is lower than the second low level.

It should be noted that, although many methods (such as a cell design with multiple thresholds, a method of dynamically adjusting the power voltage) are adopted to improve the reliability of the cell structure, it is necessary to refresh the cell structure in its entirety to further reduce the risk of the cell structure.

Figure 7:
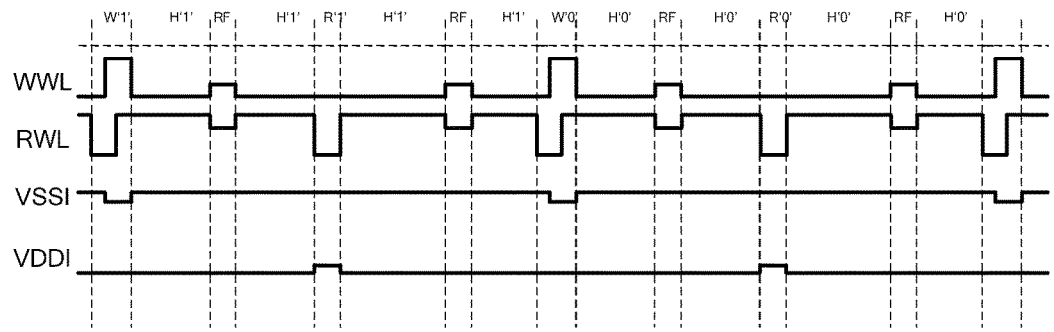
FIG. 7 is a sequence diagram illustrating an entire operation for a cell structure of a random access memory according to an exemplary embodiment of the present disclosure.

A sequence diagram illustrating an entire operation may be obtained according to the above-mentioned four operations, as shown in FIG. 7. Referring to FIG. 7, a control of the operations for the cell structure of the SRAM according to embodiments of the present disclosure is simple, a state of the cell structure of the SRAM is stable, the stored data is not lost as long as the cell structure of the SRAM is not disenergized and the power consumption is low. Compared to the cell structure of the conventional SRAM, the integration level of the cell structure of the SRAM is high, such that the cell structure of the SRAM is an effective solution to a memory cell of an IP core in a SOC, and is suitable for a computer system with a huge capacity.

3. A Random Access Memory

The present disclosure further provides a random access memory (such as a SSRAM), including a plurality of the above-mentioned cell structure of a random access memory.

Since the random access memory according to embodiments of the present disclosure includes the above-mentioned cell structure of a random access memory, the random access memory has advantages that a control circuit of the random access memory is simple, a state of the random access memory is stable, and the stored data is not lost as long as the random access memory is not disenergized, and the power consumption is low. The integration level of the SRAM according to embodiments of the present disclosure is high, such that the SRAM is an effective solution of a memory cell of an IP core in a SOC, and is suitable for a computer system with a huge capacity.

4. A Write Operation Method for a Random Access Memory

If the random access memory includes the plurality of the above-mentioned cell structure of a random access memory, the plurality of the above-mentioned cell structure may form arrays, which may refer to the related art.

Considering the size of the array in the random access memory, a width of the data that the random access memory can operate synchronously and a working speed of the random access memory, two different select operation strategies are provided.

Select operation strategy 1: Firstly, a given address is received, in which the given address includes a row address and a column address; then a read operation is performed on all data in a selected row corresponding to the row address, and then data to be written is written into a memory cell of a selected column corresponding to the column address in the selected row, meanwhile stored data is rewritten into a memory cell of an unselected column corresponding to the column address in the selected row, in which the stored data is data previously read.

Select operation strategy 2: a logic operation is performed on a row address signal obtained based on row decoding and a column address signal obtained based on column decoding after an address is decoded; the write operation is performed on a selected column and no operation on other unselected columns.

For a column selected by the random access memory according to embodiments of the present disclosure, the write operation for the cell structure may be performed in the selected column, which is described in part 2.2, not discussed herein.

5. A maintain operation method, a read operation method and a refresh operation method for a random access memory may refer to the above description of the cell structure, which is not discussed herein.

6. Another Random Access Memory

Figure 10A:
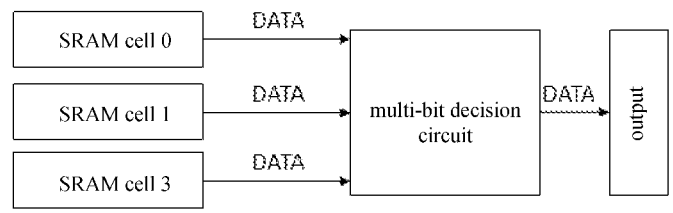
FIG. 10a is a schematic diagram illustrating a principle of a Triple Modular Redundancy harden method in the related art.

In the related art, a common harden technology is a Triple Modular Redundancy (TMR) harden method which is a circuit design harden technology. But the Triple Modular Redundancy harden method exactly is a harden technology for an architecture. FIG. 10a illustrates the principle of the Triple Modular Redundancy harden method for resisting the single event upset. The principle of the Triple Modular Redundancy harden method is that two redundant memory cells are added, and output results of three memory cells are sent to a multi-bit decision circuit, and a decided result is used as a final output result. A truth table of the multi-bit decision circuit is shown in Table 2. Referring to Table 2, if data in one of the three memory cells changes, wrong data may be avoided after the decided result is obtained by the multi-bit decision circuit.

TABLE 2

| SRAM cell 0 | SRAM cell 1 | SRAM cell 2 | output |
| --- | --- | --- | --- |
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

In a radiation environment, a storage node is affected by the single event upset. It is possible that both a "0" and a "1" can be reversed. In an application of the Triple Modular Redundancy method, since a SRAM with six transistors adopts a double latch method and the information is stored with two storage nodes, on one hand, the SRAM can maintain its data and avoid being refreshed, and on the other hand, the SRAM brings a disadvantage that if data in one storage node is reversed because of a radiation effect, the data is lost in perpetuity. In order to identify correct data by comparing by a periphery circuit, two redundant memory cells are compared with each other in the Triple Modular Redundancy harden method. Undoubtedly, with the added two redundant memory cells, the size of the periphery circuit and the complexity of the periphery circuit are increased, such that the Triple Modular Redundancy harden method is restricted in practical practice.

Figure 8:
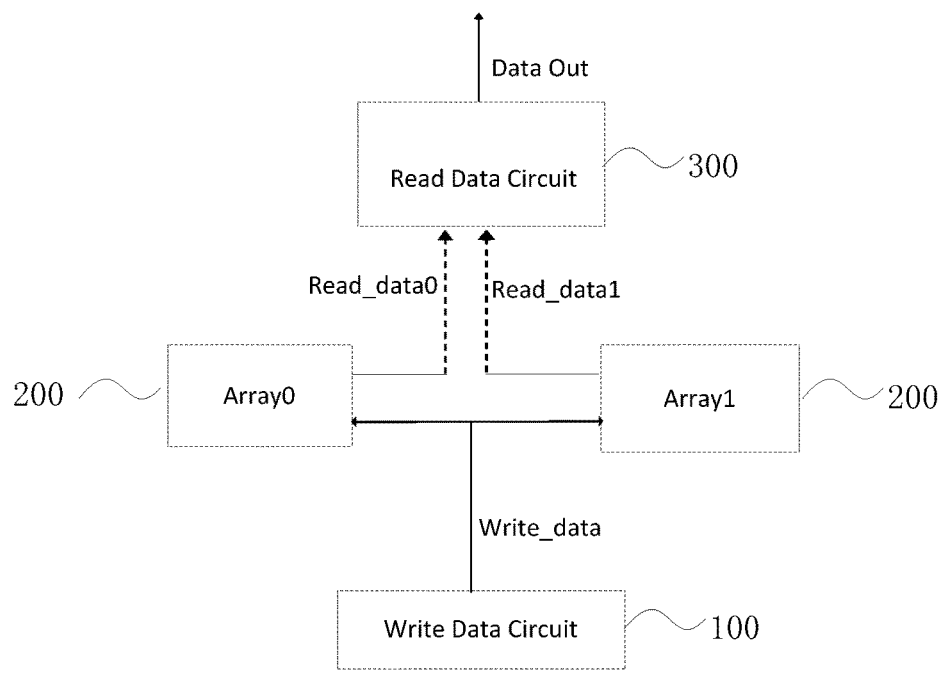
FIG. 8 is a block diagram illustrating a random access memory according to an embodiment of the present disclosure.

As shown in FIG. 8, the present disclosure further provides a random access memory. The random access memory may include a write data circuit 100, two identical memory cell arrays 200, a read data circuit 300 and an essential periphery circuit (it is general knowledge of those skilled in the art, so it is not shown). Array structures of the two identical memory cell arrays 200 are same, and same original information is stored in memory cells with a same address in the two identical memory cell arrays 200. The write data circuit 100 is configured to write same data into the memory cells with the same address in the two identical memory cell arrays 200. The read data circuit 300 is configured to select two pieces of stored information from the memory cells with the same address in the two identical memory cell arrays 200, and to output "0" if the two pieces of stored information are different or output one of the two pieces of stored information if the two pieces of stored information are same.

With the random access memory according to the above embodiment of the present disclosure, an aim of resisting the single event upset may be realized reliably. And compared to other harden methods, the random access memory according to the harden method of the present disclosure has a same access speed as other random access memories according to other harden methods and a high error correction capability and other advantages, such as a small size, a simple peripheral circuit, and a good technology compatibility, such that the random access memory according to embodiments of the present disclosure may be wildly applied in a field of a memory resisting the radiations.

Figure 9:
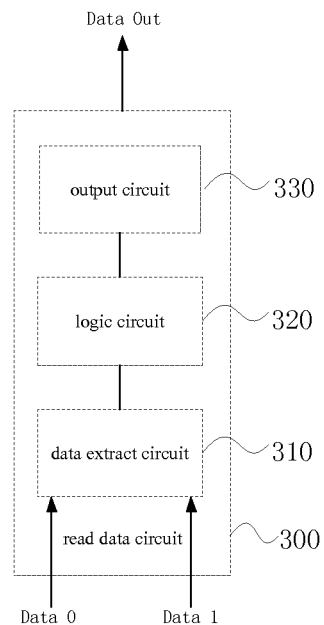
FIG. 9 is a schematic diagram illustrating a read data circuit in a random access memory according to an embodiment of the present disclosure.

In an embodiment of the present disclosure, as shown in FIG. 9, the read data circuit 300 includes a data extract circuit 310, a logic circuit 320 and an output circuit 330. The data extract circuit 310 is connected to the two identical memory cell arrays 200, and is configured to select the two pieces of stored information from the memory cells with the same address in the two identical memory cell arrays 200. The logic circuit 320 is connected to the data extract circuit 310, and is configured to judge whether the two pieces of stored information are same. The output circuit 330 is connected to the logic circuit 320, and is configured to output "0" if the two pieces of stored information are different or to output one of two pieces of stored information if the two pieces of stored information are same.

In an embodiment of the present disclosure, each of the two identical memory cell arrays 200 includes a SRAM cell with four transistors, in which the SRAM cell has the cell structure descripted in parts 1 and 2, not discussed herein.

In order to make those skilled in the art better understand, in the following, the random access memory according to embodiments of the present disclosure which is based on a SRAM cell with four transistors and adopts a Two Modular Redundancy harden method is described in detail.

6.1. Storage Characteristics of a Memory Cell (1) A "0" is Stored

If the memory cell is in a state of maintaining a "0": a "0" is stored in the first storage node (Q), a "1" is stored in the second storage node (Qn), both the second PMOS transistor (P1) and the second NMOS transistor (N1) are in an OFF state. However, due to an electricity leakage of the second PMOS transistor (P1) and an electricity leakage of the second NMOS transistor (N1), the voltage of the first storage node (Q) rises gradually, and the voltage of the second storage node (Qn) drops gradually. If the rise of the voltage of the first storage node (Q) results in the second NMOS transistor (N1) being turned on or the drop of the voltage of the second storage node (Qn) results in the second PMOS transistor (P1) being turned on, the stored information is lost.

In order to maintain the voltage of the first storage node (Q) at a low level, the second PMOS transistor (P1) is configured as a PMOS transistor with a high threshold to reduce the leakage current and the first NMOS transistor (NG1) is configured as a NMOS transistor with a standard threshold to increase the leakage current (a maintain state: the adjustable high voltage (VDDI) is at a high level and the first bit line (BL) is grounded).

In order to maintain the voltage of the second storage node (Qn) at the high level, the second NMOS transistor (N1) is configured as a NMOS transistor with a high threshold to reduce the leakage current and the first PMOS transistor (PG1) is configured as a PMOS transistor with a standard threshold to increase the leakage current (a maintain state: the adjustable low voltage (VSSI) is at the high level and the second bit line (BLn) is charged to the high level).

(2) A "1" is Stored

If the memory cell is in a state of maintaining a "1", a "1" is stored in the first storage node (Q), a "0" is stored in the second storage node (Qn), both the second PMOS transistor (P1) and the second NMOS transistor (N1) are in an ON state. The maintain performance of the memory cell is good.

6. 2. Operational Principle (1) Write

A. A "0" is Written

If a "0" is written into the memory cell, the second PMOS transistor (P1) is changed from an ON state to an OFF state, the second NMOS transistor (N1) is changed from an ON state to an OFF state, and it takes a long time to write a "1" into the second storage node Qn. In order to save writing time, the memory cell performs a write operation with three phases of writing.

B. A "1" is Written

If a "1" is written into the memory cell, it is necessary to change the second NMOS transistor (N1) from an OFF state to an ON state and to ensure that a difference value of the gate voltage ($V_{Gn}$) of the second NMOS transistor (N1) minus the adjustable low voltage (VSSI) is greater than the threshold voltage of the second NMOS transistor (N1) (i.e. $V_{Gn}-VSSI>V_{thn}$). Due to a loss of the threshold voltage of the first NMOS transistor (NG1), a voltage less than the power voltage (VDD) may be written into the first storage node (Q) and represents "1", and it is difficult to turn on the second NMOS transistor (N1). The adjustable high voltage (VDDI) and the adjustable low voltage (VSSI) in a writing state are adjusted, for example VSSI=0 v, VDDI=0.85 v.

(2) Read

A. A "0" is Read

If a "0" is read from the memory cell, the second bit line (BLn) does not discharge and it is not necessary to consider the speed and the power consumption of the memory cell.

B. A "1" is Read

If a "1" is read from the memory cell, the second bit line (BLn) discharges via the second NMOS transistor (N1), the reading speed depends on a discharging speed of the second NMOS transistor (N1). The higher the voltage of the first storage node (Q) is, the faster the reading speed is. The adjustable high voltage (VDDI) and the adjustable low voltage (VSSI) in a writing state are adjusted, which are VSSI=0 v, VDDI=1.2 v.

6. 3. The Principle of the Single Event Upset in the SRAM with Four Transistors

Like the SRAM with six transistors, the SRAM with four transistors stores data in two storage nodes. The differences are that the SRAM with six transistors adopts a double latch structure, such that both a "0" and a "1" in the SRAM with six transistors can be maintained, while the SRAM with four transistors according to embodiments of the present disclosure just latches a "1" and maintains a "0" using the above-mentioned structure and method. The information latch methods for the SRAM with six transistors and the SRAM with four transistors are different, such that on one hand the method of maintaining a "0" in the SRAM with four transistors is complex, on the other hand the SRAM with four transistors has advantages in an application of resisting radiations, because that the SRAM with six transistors adopts the Triple Modular Redundancy harden method while the SRAM with four transistors adopts the Two Modular Redundancy harden method.

In a radiation environment, the depletion layer of a reverse biased PN junction at a drain area of a MOS transistor which is in an OFF state is a sensitive area of the single event upset. In the following, take a memory cell with four transistors as an example, a situation that the single event upset has an effect on a storage node and an application of the Two Modular Redundancy harden method in the memory cell with four transistors will be described.

(1) A "0" is Reversed to a "1"

Assuming that in a maintain state Q="0" and Qn="1", at this time a "0" is stored. In a maintain mode, both the first NMOS transistor (NG1) and the first PMOS transistor (PG1) are in an OFF state, the second NMOS transistor (N1) and the second PMOS transistor (P1) are in an OFF state, at this time, if a high-energy particle comes into a drain area of the second PMOS transistor (P1) which is in an OFF state and the high-energy particle results in a high enough transient current. The transient current pulls the level of the drain electrode of the second PMOS transistor (P1) (i.e. the level of the first storage node (Q)) up to a high level. And then, the second NMOS transistor (N1) is turned on and the high level of the second storage node (Qn) is pulled down to the low level and the second PMOS transistor (P1) is turned on, such that the "0" is reversed to a "1", and the "1" is maintained in a feedback loop consisted of the second NMOS transistor (N1) and the second PMOS transistor (P1).

(2) A "1" is Reversed to a "0"

Assuming that in a maintain state Q="1" and Qn="0", at this time a "1" is stored. In a maintain mode, both the first NMOS transistor (NG1) and the first PMOS transistor (PG1) are in an OFF state, both the second NMOS transistor (N1) and the second PMOS transistor (P1) are in an ON state, the memory cell has a good maintain performance by means of the feedback loop. At this time, if a high-energy particle comes into a drain area of the first NMOS transistor (NG1) and the high-energy particle results in a high enough transient current. The transient current pulls the level of the drain electrode of the first NMOS transistor (NG1) (i.e. the level of the first storage node (Q)) down to a low level, such that the second NMOS transistor (N1) is turned off and the "0" is maintained in the second storage node (Qn) and the "0" is unaffected. The second PMOS transistor (P1) maintains in an ON state. Since the effect brought by the high-energy particle is transient, after data stored in the first storage node (Q) is reversed, the data is recovered to a "1" under the effect of the pull-up of the second PMOS transistor (P1). Meanwhile, the second NMOS transistor (N1) is turned on, such that the original stored data is recovered and maintained.

6. 4. The Two Modular Redundancy Harden Method

Figure 10B:
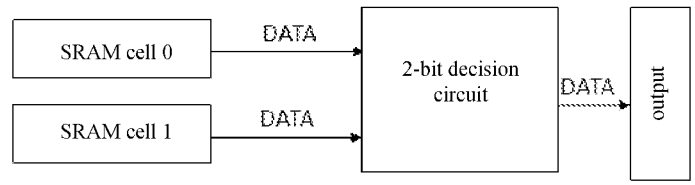
FIG. 10b is a schematic diagram illustrating a principle of a Two Modular Redundancy harden method provided in the present disclosure.

As mentioned above, the SRAM with four transistors has a problem that a "0" is reversed to a "1" and has no problem that a "1" is reversed to a "0" if the SRAM is affected by the single event upset effect. Thus, it is workable to realize the Two Modular Redundancy harden method. FIG. 10b illustrates the principle of the Two Modular Redundancy harden method. The idea of the Two Modular Redundancy harden method is that a redundant memory cell is added, and output results of the two SRAM cells with four transistors are sent to a 2-bit decision circuit, a decided result is used as a final output result. A truth table of the 2-bit decision circuit is shown in Table 3. Referring to Table 3, the original stored data is a "0" as long as the output results of the two SRAM cells are different, and the original stored is one of the output results if the output results are same.

TABLE 3

| SRAM cell 0 | SRAM cell 1 | output |
|---|---|---|
| 0 | 0 | 0 |
| 0 | 1 | 0 |
| 1 | 0 | 0 |
| 1 | 1 | 1 |

In some embodiments, this truth table of the 2-bit decision circuit shown in Table 3 may be realized as a AND gate.

With the random access memory according to embodiments of the present disclosure, an aim of resisting the single event upset is realized reliably. And compared to other harden methods, the random access memory according to the harden method of the present disclosure has a same access speed as other random access memories according to other harden methods and a high error correction capability and other advantages, such as a small size, a simple peripheral circuit, and a good compatibility, such that the random access memory according to embodiments of the present disclosure may be wildly applied in a field of a memory resisting the radiations.

7. Operation Methods for the Random Access Memory in Section 6

The random access memory may be described in section 6 by using the Two Modular Redundancy harden method.

7.1 a Read Operation Method for the Random Access Memory

Firstly, data from two memory cells with a same address in the two identical memory cell arrays is read; secondly, it is determined whether the data from the two memory cells with a same address in the two identical memory cell arrays is same; and then if the data from the two memory cells with a same address in the two identical memory cell arrays is different, "0" is outputted, and else if the data from the two memory cells with a same address in the two identical memory cell arrays is same, one of the data from the two memory cells with a same address in the two identical memory cell arrays is outputted.

7.2 a Write Operation Method for the Random Access Memory

Same data is written into two memory cells with a same address in the two identical memory cell arrays.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A cell structure of a random access memory, comprising: a first N-type transistor (N1), a first P-type transistor (P1), a second N-type transistor (NG1) and a second P-type transistor (PG1); wherein
a source electrode of the first N-type transistor (N1) is connected to an adjustable low voltage (VSSI), a source electrode of the first P-type transistor (P1) is connected to an adjustable high voltage (VDDI), a drain electrode of the first N-type transistor (N1) is connected to a gate electrode of the first P-type transistor (P1), a gate electrode of the first N-type transistor (N1) is connected to a drain electrode of the first P-type transistor (P1),
a drain electrode of the second N-type transistor (NG1) is connected to a bit line (BL), a gate electrode of the second N-type transistor (NG1) is connected to a write word line (WWL), a source electrode of the second N-type transistor (NG1) is connected to a first node (Q) between the gate electrode of the first N-type transistor (N1) and the drain electrode of the first P-type transistor (P1),
a drain electrode of the second P-type transistor (PG1) is connected to a complementary bit line (BLn), a gate electrode of the second P-type transistor (PG1) is connected to a read word line (RWL), a source electrode of the second P-type transistor (PG1) is connected to a second node (Qn) between the drain electrode of the first N-type transistor (N1) and the gate electrode of the first P-type transistor (P1).

2. The cell structure according to claim 1, wherein an absolute value of a threshold voltage of the first N-type transistor (N1) is greater than an absolute value of a threshold voltage of the second N-type transistor (NG1), and an absolute value of a threshold voltage of the first P-type transistor (P1) is greater than an absolute value of a threshold voltage of the second P-type transistor (PG1).

3. The cell structure according to claim 1, wherein a substrate of the first N-type transistor (N1) and a substrate of the second N-type transistor (NG1) are connected to a ground voltage (GND) respectively, and a substrate of the first P-type transistor (P1) and a substrate of the second P-type transistor (PG1) are connected to a power voltage (VDD) respectively.

4. The cell structure according to claim 1, wherein the adjustable low voltage (VSSI) is greater than or equal to the ground voltage (GND) and less than a half of the power voltage (VDD/2); the adjustable high voltage (VDDI) is less than or equal to the power voltage (VDD) and greater than the half of the power voltage (VDD/2).

5. The cell structure according to claim 1, wherein if the cell structure is in a maintain operation, the write word line (WWL) is maintained at a first low level, the read word line (RWL) is maintained at a first high level, the bit line (BL) is maintained at the first low level, the complementary bit line (BLn) is maintained at the first high level, the adjustable high voltage (VDDI) is maintained at a second high level, and the adjustable low voltage (VSSI) is maintained at a second low level, wherein the first high level is higher than the second high level, the first low level is lower than the second low level.

6. The cell structure according to claim 1, wherein if the cell structure is in a write operation comprising three phases of writing, the write word line (WWL) is maintained at a first low level in a first phase of writing, and is maintained at a first high level in a second phase of writing and a third phase of writing;

the read word line (RWL) is maintained at the first low level in the first phase of writing and the second phase of writing, and is maintained at the first high level in the third phase of writing;

the bit line (BL) is maintained at the first high level in the first phase of writing, the second phase of writing and the third phase of writing, if "1" is written, or the bit line (BL) is maintained at the first low level in the first phase of writing, the second phase of writing and the third phase of writing, if "0" is written;

the complementary bit line (BLn) is maintained at the first high level in the first phase of writing, the second phase of writing and the third phase of writing;

the adjustable high voltage (VDDI) is maintained at a second high level in the first phase of writing, the second phase of writing and the third phase of writing, wherein the first high level is higher than the second high level; and the adjustable low voltage (VSSI) is maintained at a second low level in the first phase of writing, and is maintained at the first low level in the second phase of writing and the third phase of writing, wherein the first low level is lower than the second low level.

7. The cell structure according to claim 1, wherein if the cell structure is in a read operation comprising two phases of reading, the write word line (WWL) is maintained at a first low level in a first phase of reading and a second phase of reading;

the read word line (RWL) is maintained at a first high level in the first phase of reading, and is maintained at the first low level in the second phase of reading;

the bit line (BL) is maintained at the first low level in the first phase of reading and the second phase of reading;

the complementary bit line (BLn) is maintained at the first high level in the first phase of reading and descended from the first high level gradually in the second phase of reading, if "1" is read, or the complementary bit line (BLn) is maintained at the first high level in the first phase of reading and the second phase of reading if "0" is read;

the adjustable high voltage (VDDI) is maintained at the first high level in the first phase of reading and the second phase of reading; and the adjustable low voltage (VSSI) is maintained at a second low level in the first phase of reading and the second phase of reading, wherein the first low level is lower than the second low level.

8. The cell structure according to claim 1, wherein if the cell structure is in a refresh operation, the write word line (WWL) is maintained at a first voltage (Vthn), wherein the first voltage (Vthn) is a larger of the absolute value of the threshold voltage of the second N-type transistor (NG1) and the absolute value of the threshold voltage of the first N-type transistor (N1);

the read word line (RWL) is maintained at a second voltage (VDD−|Vthp|), wherein the second voltage (VDD−|Vthp|) is a difference value of the power voltage (VDD) minus a third voltage (|Vthp|), wherein the third voltage (|Vthp|) is a larger of the absolute value of the threshold voltage of the second P-type transistor (PG1) and the absolute value of the threshold voltage of the first P-type transistor (P1);

the bit line (BL) is maintained at a first low level;

the complementary bit line (BLn) is maintained at a first high level;

the adjustable high voltage (VDDI) is maintained at a second high level, wherein the first high level is higher than the second high level;

the adjustable low voltage (VSSI) is maintained at a second low level, wherein the first low level is lower than the second low level.

9. A random access memory, comprising a plurality of cell structures of the random access memory, wherein the cell structure of a random access memory comprises: a first N-type transistor (N1), a first P-type transistor (P1), a second N-type transistor (NG1) and a second P-type transistor (PG1), in which a source electrode of the first N-type transistor (N1) is connected to an adjustable low voltage (VSSI), a source electrode of the first P-type transistor (P1) is connected to an adjustable high voltage (VDDI), a drain electrode of the first N-type transistor (N1) is connected to a gate electrode of the first P-type transistor (P1), a gate electrode of the first N-type transistor (N1) is connected to a drain electrode of the first P-type transistor (P1), a drain electrode of the second N-type transistor (NG1) is connected to a bit line (BL), a gate electrode of the second N-type transistor (NG1) is connected to a write word line (WWL), a source electrode of the second N-type transistor (NG1) is connected to a first node (Q) between the gate electrode of the first N-type transistor (N1) and the drain electrode of the first P-type transistor (P1), a drain electrode of the second P-type transistor (PG1) is connected to a complementary bit line (BLn), a gate electrode of the second P-type transistor (PG1) is connected to a read word line (RWL), a source electrode of the second P-type transistor (PG1) is connected to a second node (Qn) between the drain electrode of the first N-type transistor (N1) and the gate electrode of the first P-type transistor (P1).

10. The random access memory according to claim 9, wherein a write operation is applied in the random access memory and the write operation comprises:

receiving a given address, wherein the given address comprises a row address and a column address;

performing a read operation on all data in a selected row corresponding to the row address;

writing data to be written into a memory cell of a selected column corresponding to the column address in the selected row, meanwhile rewriting stored data into a memory cell of an unselected column corresponding to the column address in the selected row, wherein the stored data is data previously read.

11. The random access memory according to claim 9, wherein a write operation is applied in the random access memory and the write operation comprises:

performing a logic operation on a row address signal obtained based on row decoding and a column address signal obtained based on column decoding after an address is decoded;

performing the write operation on a selected column and no operation on other unselected columns.

12. The random access memory according to claim 10, wherein if the write operation is applied in the random access memory, the cell structure is in a write operation comprising three phases of writing, the write word line (WWL) is maintained at a first low level in a first phase of writing, and is maintained at a first high level in a second phase of writing and a third phase of writing;

the read word line (RWL) is maintained at the first low level in the first phase of writing and the second phase of writing, and is maintained at the first high level in the third phase of writing;

the bit line (BL) is maintained at the first high level in the first phase of writing, the second phase of writing and the third phase of writing, if "1" is written, or the bit line (BL) is maintained at the first low level in the first phase of writing, the second phase of writing and the third phase of writing, if "0" is written;

the complementary bit line (BLn) is maintained at the first high level in the first phase of writing, the second phase of writing and the third phase of writing;

the adjustable high voltage (VDDI) is maintained at a second high level in the first phase of writing, the second phase of writing and the third phase of writing, wherein the first high level is higher than the second high level; and the adjustable low voltage (VSSI) is maintained at a second low level in the first phase of writing, and is maintained at the first low level in the second phase of writing and the third phase of writing, wherein the first low level is lower than the second low level.

13. The random access memory according to claim 11, wherein if the write operation is applied in the random access memory, the cell structure is in a write operation comprising three phases of writing, the write word line (WWL) is maintained at a first low level in a first phase of writing, and is maintained at a first high level in a second phase of writing and a third phase of writing;

the read word line (RWL) is maintained at the first low level in the first phase of writing and the second phase of writing, and is maintained at the first high level in the third phase of writing;

the bit line (BL) is maintained at the first high level in the first phase of writing, the second phase of writing and the third phase of writing, if "1" is written, or the bit line (BL) is maintained at the first low level in the first phase of writing, the second phase of writing and the third phase of writing, if "0" is written;

the complementary bit line (BLn) is maintained at the first high level in the first phase of writing, the second phase of writing and the third phase of writing;

the adjustable high voltage (VDDI) is maintained at a second high level in the first phase of writing, the second phase of writing and the third phase of writing, wherein the first high level is higher than the second high level; and the adjustable low voltage (VSSI) is maintained at a second low level in the first phase of writing, and is maintained at the first low level in the second phase of writing and the third phase of writing, wherein the first low level is lower than the second low level.

14. The random access memory according to claim 9, wherein a read operation is applied in the random access memory and the read operation comprises:

performing a logic operation on a row address signal obtained based on row decoding and a column address signal obtained based on column decoding after an address is decoded;

performing the read operation on a selected column and no operation on other unselected columns.

15. The random access memory according to claim 14, wherein if the read operation is applied in the random access memory, the cell structure is in a read operation comprising two phases of reading, the write word line (WWL) is maintained at a first low level in a first phase of reading and a second phase of reading;

the read word line (RWL) is maintained at a first high level in the first phase of reading, and is maintained at the first low level in the second phase of reading;

the bit line (BL) is maintained at the first low level in the first phase of reading and the second phase of reading;

the complementary bit line (BLn) is maintained at the first high level in the first phase of reading and descended from the first high level gradually in the second phase of reading, if "1" is read, or the complementary bit line (BLn) is maintained at the first high level in the first phase of reading and the second phase of reading if "0" is read;

the adjustable high voltage (VDDI) is maintained at the first high level in the first phase of reading and the second phase of reading; and the adjustable low voltage (VSSI) is maintained at a second low level in the first phase of reading and the second phase of reading, wherein the first low level is lower than the second low level.

16. The random access memory according to claim 9, wherein a maintain operation is applied in the random access memory, and the cell structure is in a maintain operation, the write word line (WWL) is maintained at a first low level, the read word line (RWL) is maintained at a first high level, the bit line (BL) is maintained at the first low level, the complementary bit line (BLn) is maintained at the first high level, the adjustable high voltage (VDDI) is maintained at a second high level, and the adjustable low voltage (VSSI) is maintained at a second low level, wherein the first high level is higher than the second high level, the first low level is lower than the second low level.

17. The random access memory according to claim 9, wherein a refresh operation is applied in the random access memory, and the cell structure is in a refresh operation, the write word line (WWL) is maintained at a first voltage (Vthn), wherein the first voltage (Vthn) is a larger of the absolute value of the threshold voltage of the second N-type transistor (NG1) and the absolute value of the threshold voltage of the first N-type transistor (N1);

the read word line (RWL) is maintained at a second voltage (VDD−|Vthp|), wherein the second voltage (VDD−|Vthp|) is a difference value of the power voltage (VDD) minus a third voltage (|Vthp|), wherein the third voltage (|Vthp|) is a larger of the absolute value of the threshold voltage of the second P-type transistor (PG1) and the absolute value of the threshold voltage of the first P-type transistor (P1);

the bit line (BL) is maintained at a first low level;

the complementary bit line (BLn) is maintained at a first high level;

the adjustable high voltage (VDDI) is maintained at a second high level, wherein the first high level is higher than the second high level;

the adjustable low voltage (VSSI) is maintained at a second low level, wherein the first low level is lower than the second low level.

18. The random access memory according to claim 9, wherein an absolute value of a threshold voltage of the first N-type transistor (N1) is greater than an absolute value of a threshold voltage of the second N-type transistor (NG1), and an absolute value of a threshold voltage of the first P-type transistor (P1) is greater than an absolute value of a threshold voltage of the second P-type transistor (PG1).

19. The random access memory according to claim 9, wherein a substrate of the first N-type transistor (N1) and a substrate of the second N-type transistor (NG1) are connected to a ground voltage (GND) respectively, and a substrate of the first P-type transistor (P1) and a substrate of the second P-type transistor (PG1) are connected to a power voltage (VDD) respectively.

20. The random access memory according to claim 9, wherein the adjustable low voltage (VSSI) is greater than or equal to the ground voltage (GND) and less than a half of the power voltage (VDD/2); the adjustable high voltage (VDDI) is less than or equal to the power voltage (VDD) and greater than the half of the power voltage (VDD/2).

* * * * *